US012256598B2

(12) United States Patent
Zheng et al.

(10) Patent No.: US 12,256,598 B2
(45) Date of Patent: Mar. 18, 2025

(54) DISPLAY PANELS AND DISPLAY DEVICES (71) Applicant: KUNSHAN GO-VISIONOX OPTO-ELECTRONICS CO., LTD., Kunshan (CN)

(72) Inventors: Tianchun Zheng, Kunshan (CN); Yi Zheng, Kunshan (CN); Junhui Zeng, Kunshan (CN); Yanqing Wang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 415 days.

(21) Appl. No.: 17/722,872

(22) Filed: Apr. 18, 2022

(65) Prior Publication Data
US 2022/0238850 A1 Jul. 28, 2022

Related U.S. Application Data (63) Continuation of application No. PCT/CN2021/081832, filed on Mar. 19, 2021.

(30) Foreign Application Priority Data

Apr. 30, 2020 (CN) .......................... 202010365099.0

(51) Int. Cl.
*H01L 51/52* (2006.01)
*G06V 40/13* (2022.01)
(Continued)

(52) U.S. Cl.
CPC ....... *H10K 50/865* (2023.02); *G06V 40/1318* (2022.01); *H10K 50/854* (2023.02)

(58) Field of Classification Search
CPC ............. H01L 27/146; H01L 31/02164; H01L 31/0232; G02F 1/133512; G02F 1/133331
See application file for complete search history.

(56) References Cited

U.S. PATENT DOCUMENTS

2013/0094184 A1 4/2013 Lee
2017/0186891 A1* 6/2017 Min ....................... G02B 5/005
(Continued)

FOREIGN PATENT DOCUMENTS

CN 103065549 A 4/2013
CN 103424957 A 12/2013
(Continued)

OTHER PUBLICATIONS

International Search Report and Written Opinion (International Application No. PCT/CN2021/081832) with English Translation, dated Jun. 23, 2021, 11 pages.
(Continued)

*Primary Examiner* — Kyoung Lee
*Assistant Examiner* — David J Goodwin
(74) *Attorney, Agent, or Firm* — Quarles & Brady LLP (57) ABSTRACT The present disclosure relates to a display panel and a display device. The display panel includes a display module, at least one color layer, and a light absorption layer. The display module has a display face and a non-display face opposite to the display face. The at least one color layer is disposed at a side of the display module away from the display face. The light absorption layer disposed at a side of the at least one color layer away from the display module. A first through hole is defined in the light absorption layer. A second through hole is defined in the at least one color layer. The second through hole is located corresponding to and in communication with the first through hole. The first through hole and the second through hole are located corresponding to an external functional module.

20 Claims, 12 Drawing Sheets (51) Int. Cl.
  *H10K 50/854* (2023.01)
  *H10K 50/86* (2023.01)

(56) References Cited

U.S. PATENT DOCUMENTS

| | | |
|---|---|---|
| 2018/0067245 A1 | 3/2018 | Giachino et al. |
| 2018/0314096 A1 | 11/2018 | Yang et al. |
| 2018/0314873 A1 | 11/2018 | Yang et al. |
| 2018/0315803 A1 | 11/2018 | Jin |
| 2020/0019747 A1 | 1/2020 | Yang et al. |
| 2020/0020737 A1 | 1/2020 | Jin |
| 2022/0262838 A1* | 8/2022 | Ozeki ............... H01L 27/14621 |

FOREIGN PATENT DOCUMENTS

| | | |
|---|---|---|
| CN | 107092311 A | 8/2017 |
| CN | 107102693 A | 8/2017 |
| CN | 107193412 A | 9/2017 |
| CN | 107194321 A | 9/2017 |
| CN | 107195675 A | 9/2017 |
| CN | 107291160 A | 10/2017 |
| CN | 108537171 A | 9/2018 |
| CN | 110825171 A | 2/2020 |
| CN | 110837190 A | 2/2020 |
| CN | 111025752 A | 4/2020 |
| CN | 111524451 A | 8/2020 |
| TW | I580270 B | 4/2017 |

OTHER PUBLICATIONS

Chinese First Office Action 100191 (CN Application No. 202010365099.0) and Search Result with English Translation, dated Jul. 2, 2021, 22 pages.

Chinese Second Office Action 100191 (CN Application No. 202010365099.0) with English Translation, dated Oct. 8, 2021, 14 pages.

* cited by examiner

DISPLAY PANELS AND DISPLAY DEVICES

CROSS-REFERENCE TO RELATED APPLICATIONS

This application is a continuation to international patent application PCT/CN2021/081832, filed on Mar. 19, 2021, which claims priority to Chinese Patent Application No. 202010365099.0, filed on Apr. 30, 2020, the contents of both applications are hereby incorporated by reference in their entireties.

TECHNICAL FIELD

The present disclosure relates to the field of display technology.

BACKGROUND

Requirements for various properties of display modules are growing with scientific and technological progress and continuous advancement of the information age. Luminance uniformity of a display module is very important. However, non-uniformity of luminance or "mura" may occur in a local area of the images displayed by the display module. Mura refers to dark spots and the like caused by the non-uniform luminance on the display module.

SUMMARY

The present disclosure relates to the field of display technology as it relates to display panels and display devices.

In view of this, there is a need to provide a display panel and a display device.

A display panel includes a display module, at least one color layer, and a light absorption layer. The display module has a display face and a non-display face opposite to the display face. The at least one color layer is disposed at a side of the display module away from the display face. The light absorption layer is disposed at a side of the at least one color layer away from the display module. A first through hole is defined in the light absorption layer. A second through hole is defined in the at least one color layer. The second through hole is located corresponding to and in communication with the first through hole. The first through hole and the second through hole are located corresponding to an external functional module.

A display device includes the above-described display panel.

In the related art, the light absorption layer defines a first through hole located corresponding to the external functional module, and no light absorption material is located corresponding to the external functional module. As a result, the difference between quantities of light respectively reflected from the region of the first through hole and the other region of the light absorption layer back to the display module may be relatively large, and the images displayed by the display module may be brighter in the region corresponding to the first through hole. In contrast, in the present disclosure, due to the arrangement of the color layer, the light emitted by the display module and the light entered into the display module from the outside can firstly arrive at the color layer and be reflected back to the display module by the color layer before the light arrives at the light absorption layer and is adsorbed by the light absorption layer. Therefore, light can be reflected back to the display module from both the region corresponding to the first through hole and the region corresponding to the outside of the first through hole, thereby reducing the light output difference of the display module between the region corresponding to the first through hole and the other region, and thus reducing the mura problem on the display panel.

DETAILED DESCRIPTION

The present disclosure is thoroughly described with reference to the relevant accompanying drawings. The accompanying drawings show embodiments of the present disclosure. However, the present disclosure may be implemented in various forms, and are not limited to the embodiments described herein. Rather, the embodiments described herein are intended to make the present disclosure more clearly and thoroughly understood.

Mura is easy to occur in the images displayed by a display module, which causes a poor user experience.

The user's requirement for the screen-to-body ratio is increasing with the rapid development of electronic equipment. Full-screen display technology receives more and more attention in the industry. To realize the full-screen display, an under-screen fingerprint technology comes into being, which accomplishes a fingerprint identification and screen-unlocking process by using a fingerprint identification sensor disposed under the display module. In electronic equipment such as a display device, a composite layer is set underneath the display module for heat dissipation, electromagnetic shielding, and external force buffering of the display module and for preventing unwanted light leakage of the display device. To install the optical fingerprint identification sensor, a through hole is required to be provided in the composite layer, and the optical fingerprint identification sensor is disposed in the through hole.

The composite layer includes a light absorption layer for absorbing light entered from the side where the display module is located to prevent unwanted light leakage of the display device. The light to be absorbed includes the light emitted by the display module and the light incident from the outside. However, since the through hole is defined in the composite layer, which divides the composite layer into a hole region and a hole-free region, the light arrived at the hole-free region of the composite layer will be absorbed by the light absorption layer, whereas the light arrived at the hole region of the composite layer will be reflected back to the display module and emits outside because no light absorption material is disposed in the hole region of the composite layer. As a result, the light output difference between the regions of the display module respectively aligned with the hole region and the hole-free region of the composite layer will be relatively large, which causes the non-uniformity of luminance, or the mura problem, in the images displayed by the display module. For example, the images will be brighter in the region corresponding to the through hole defined in the composite layer.

Figure 1:
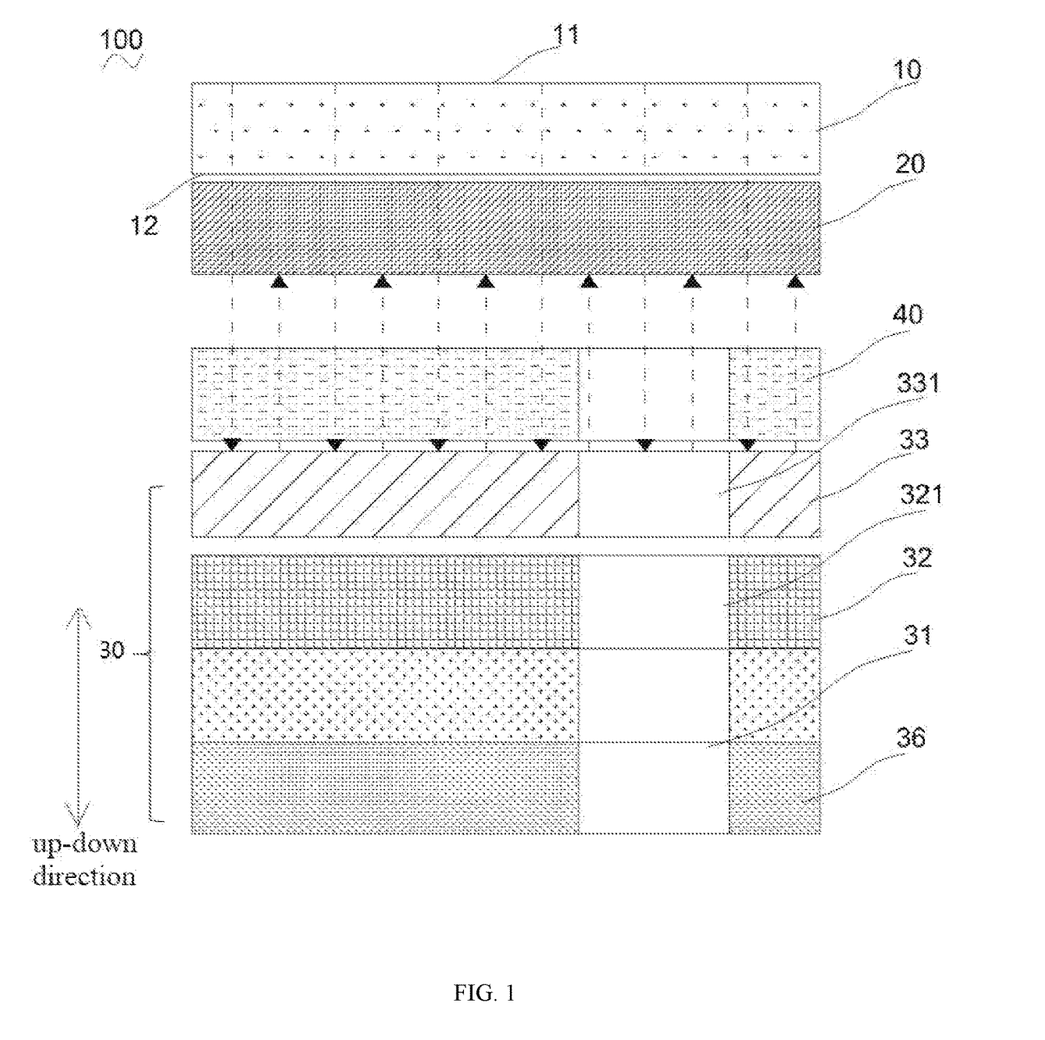
FIG. 1 is an exploded sectional view of a display panel according to an embodiment of the present disclosure.

The embodiments of the present disclosure provide a display panel and a display device to solve the above problem. FIG. 1 is an exploded sectional view of a display panel 100 according to an embodiment of the present disclosure.

Referring to FIG. 1, the display panel 100 includes a display module 10. The display module 10 has a display face 11 and a non-display face 12 opposite to each other in a first direction. The first direction is a thickness direction of the display panel 100, which is the up-down direction in FIG. 1. The display module 10 may be a flexible display module. The flexible display module may be an organic light-emitting display module such as a flexible organic light-emitting diode (OLED) display module, or other bendable flexible display module, such as a Micro LED flexible display module or a quantum dot flexible display module, which is not specifically limited herein.

In an embodiment, the display panel 100 includes the display module 10 and a composite layer 30. The composite layer 30 includes a light absorption layer 32 and at least one color layer 33. The at least one color layer 33 is disposed between the light absorption layer 32 and the display module 10. A through hole 31 is defined in and extends through the composite layer 30 in the first direction. The through hole 31 is located corresponding to an external functional module such as an optical fingerprint identification sensor. When the user's finger is put onto the display module 10, the optical fingerprint identification sensor acquires a fingerprint image based on the specular reflection principle. The fingerprint image is converted into digital data by a digital signal processor. Then, the digital data is compared with digital data of the fingerprint, recorded in a fingerprint database by a microcontroller, in order to accomplish the fingerprint identification. In the composite layer 30, the region provided with through hole 31 is defined as a hole region, while the region provided with no through hole 31 is defined as a hole-free region. Through hole 31 includes a first through hole 321 defined in the light absorption layer 32 and a second through hole 331 defined in the at least one color layer 33. The second through hole 331 is located corresponding to (for example, aligned with), and in communication with, the first through hole 321. In this way, the light emitted by the display module 10, or the light entered into the display module 10 from the outside, may firstly arrive at the at least one color layer 33 and be reflected back to the display module 10 by the at least one color layer 33 before the light arrives at the light absorption layer 32 and is adsorbed by the light absorption layer 32, as shown in FIG. 1 with the dotted lines having arrows and indicating the path of the light. Therefore, due to the presence of the color layer 33, light may be reflected back to the display module 10 both in the region of the display module 10 aligned with the hole region of the composite layer 30 and in the region of the display module 10 aligned with the hole-free region of the composite layer 30, thereby reducing the light output difference between the regions of the display module 10 respectively aligned with the hole region and the hole-free region of the composite layer 30 and reducing the mura problem on the display panel.

The size and shape of through hole 31 is not limited as long as a projection of the through hole 31 on the display module 10 is at least partially overlapped with a projection of the functional module on the display module 10. For example, the through hole 31 can have a cross-sectional shape of circular, oval, or rhombus. A cross-sectional size of the through hole 31 can be larger than a cross-sectional size of the functional module. Alternatively, the cross-sectional size of the through hole 31 may be smaller than a cross-sectional size of a part of the functional module. Alternatively, the cross-sectional size of the through hole 31 may be equal to the cross-sectional size of the functional module. When the cross-sectional size of the through hole 31 is smaller than the cross-sectional size of a part of the functional module, the part of the functional module can be disposed outside the through hole 31, and the remaining part of the functional module may be disposed in the through hole 31.

A cross-sectional size of the first through hole 321 can be equal to a cross-sectional size of the second through hole 331, so that the projections of the first through hole 321 and the second through hole 331 on the display module 10 coincide with each other, and all of the light incident into the through hole 31 can be incident into the functional module.

In another embodiment, the cross-sectional sizes of the first through hole 321 and the second through hole 331 may be different, and the projection of one of the first through hole 321 and the second through hole 331 on the display module 10 fall within the projection of the other one of the first through hole 321 and the second through hole 331 on the display module 10, so that the incident light cannot be blocked.

In an embodiment, the light absorption layer 32 is made of a black foam, which is a foamed plastic material having resilience, so that the light absorption layer 32 can not only absorb light, but also provide the buffer function when an external force is exerted onto the display module 10.

In another embodiment, the light absorption layer 32 may be made of other materials such as a dark ink. The material of the light absorption layer 32 is not limited as long as the light absorption layer 32 can absorb light and does not interfere the normal working of the display panel 100.

In an embodiment, a reflectivity of the at least one color layer 33 is larger than or equal to 50%, so that more light can be reflected back to the display module 10, and the intensities of the reflected light received by the regions of the display module 10 respectively aligned with the hole region and the hole-free region of the composite layer 30 can tend to be identical, thereby reducing the light output difference between the regions of the display module 10 respectively aligned with the hole region and the hole-free region of the composite layer 30 and reducing the mura problem on the display panel. The term "reflectivity" used herein refers to a ratio of quantity of light reflected by a surface of an object to quantity of light received by the surface of the object. It should be understood that the at least one color layer 33 is not necessary to be a portion of the composite layer 30.

In some other embodiments, the display panel 100 may further include a support layer 20 disposed between the composite layer 30 and the display module 10 to support and protect the display module 10. The support layer 20 can include a first substrate 21 which can be made of, for example, polyethylene terephthalate (PET, also called polyethylene glycol terephthalate, which is a thermoplastic polyester and is a polycondensate of terephthalic acid and ethylene glycol or formed from a saturated polyester). The at least one color layer 33 is included in the support layer 20. That is, the at least one color layer 33 is a portion of the support layer 20 in this embodiment. In this case, the second through hole 331 is not required to be provided in the at least one color layer 33.

It should be noted that when the at least one color layer 33 is a portion of the support layer 20 and no through hole is provided in the at least one color layer 33, in order to ensure the normal working of the optical fingerprint sensor, the at least one color layer 33 has a light transmittance which allows a part of light to pass therethrough, but does not reflect all of light back to the display module 10. The light transmittance of the at least one color layer 33 from the side facing the display module 10 to the side facing the light absorption layer 32 can be larger than or equal to 60%. The term "light transmittance" used herein indicates the ability of light to pass through an object and refers to a percentage of a flux of light passed through an object (such as a transparent object or a semi-transparent object) in the total flux of incident light.

It should be understood that in some embodiments, the at least one color layer 33 is a portion of the composite layer 30. In some embodiments, the at least one color layer 33 is a portion of the support layer 20. In other embodiments, the at least one color layer 33 can be a layer separated from the composite layer 30 and the support layer 20. This is not specifically limited herein. In the case that the at least one color layer 33 is a layer separated from the composite layer 30 and the support layer 20, the second through hole 331 can be defined in the at least one color layer 33, or a light transmittance of the region of the at least one color layer 33 located corresponding to (for example, aligned with) the functional module region is larger than or equal to 60%, as appropriate.

The composite layer 30 can further include an adhesive layer 40 to bond the layers of the composite layer 30 together. A material of the adhesive layer 40 can be, for example, double faced adhesive material, liquid adhesive material, etc.

In an embodiment, the at least one color layer 33 includes at least two color layers to enhance the reflection effect. The at least one color layer 33 can include at least two color layers stacked with each other. It should be noted that when the at least one color layer 33 includes at least two color layers stacked with each other, the least two color layers can be directly stacked with each other, or indirectly stacked with each other via other layer structure(s). For example, when the at least one color layer 33 includes a first color layer and a second color layer stacked with each other, the first color layer and the second color layer can be directly stacked with each other, or an additional layer can be disposed between the first color layer and the second color layer so that the first color layer and the second color layer are indirectly stacked with each other via the additional layer. When the at least one color layer 33 includes a first color layer, a second color layer, and a third color layer stacked with each other, the first color layer, the second color layer, and the third color layer can be directly stacked with each other, or an additional layer can be disposed between the first color layer and the second color layer and/or between the second color layer and the third color layer so that the first color layer, the second color layer, and the third color layer are indirectly stacked with each other via the additional layer(s).

Figure 2:
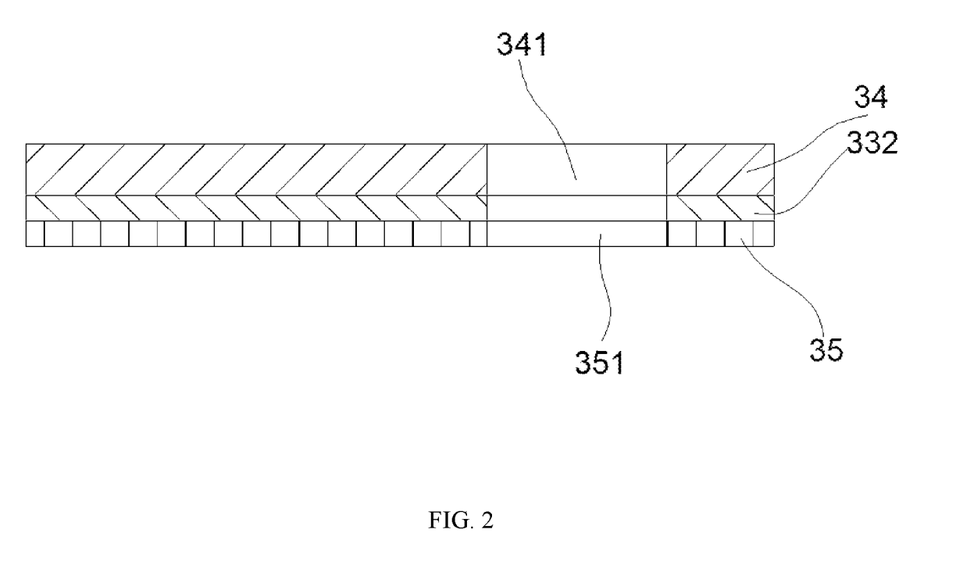
FIG. 2 is a schematic sectional view of a partial structure of a composite layer of the display panel according to an embodiment of the present disclosure.
Figure 3:
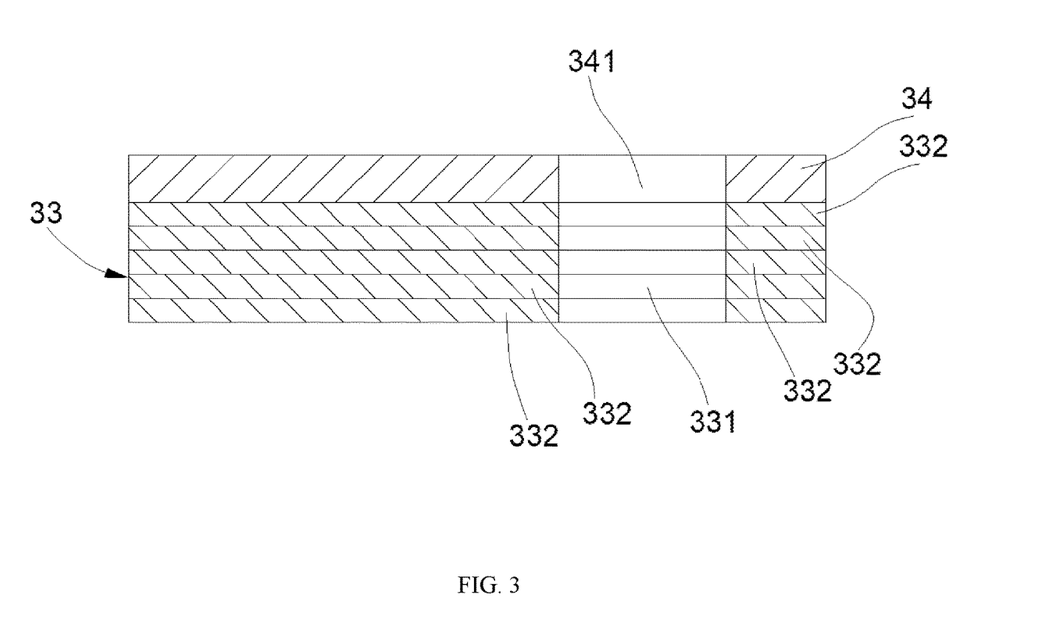
FIG. 3 is a schematic sectional view of a partial structure of the composite layer of the display panel according to another embodiment of the present disclosure.
Figure 4:
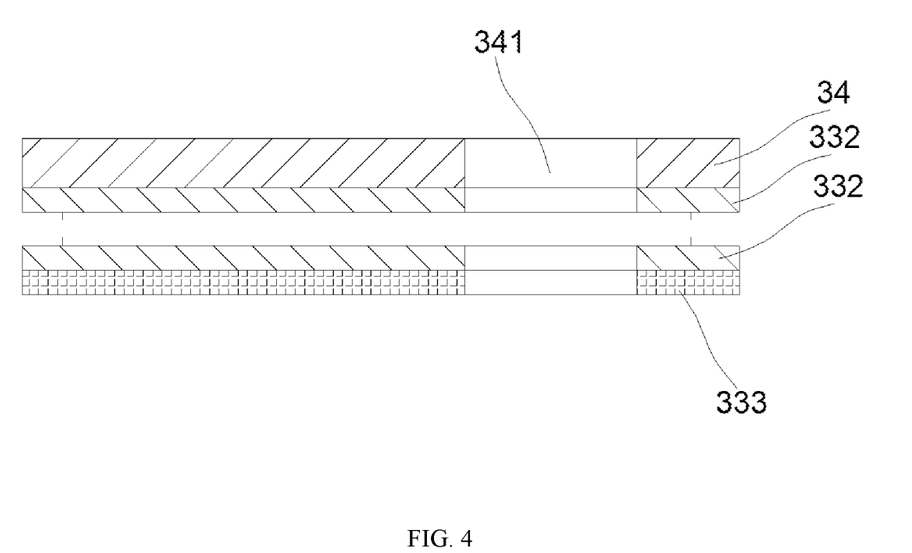
FIG. 4 is a schematic sectional view of a partial structure of the composite layer of the display panel according to another embodiment of the present disclosure.

FIG. 2 is a schematic sectional view of a partial structure of a composite layer of a display panel according to another embodiment of the present disclosure. FIG. 3 is a schematic sectional view of a partial structure of a composite layer of a display panel according to yet another embodiment of the present disclosure. FIG. 4 is a schematic sectional view of a partial structure of a composite layer of a display panel according to yet another embodiment of the present disclosure.

Referring to FIG. 2, the composite layer 30 can further include a second substrate 34 which is transparent and can be made of, for example, PET. The at least one color layer 33 is stacked with the second substrate 34. A third through hole 341 is defined in the second substrate 34. The third through hole 341 is located corresponding to (for example, aligned with) and in communication with the first through hole 321 and the second through hole 331. The third through hole 341 is located corresponding to the external functional module. The at least one color layer 33 can be formed on the second substrate 34 by a printing or coating method. In this case, the second substrate 34 is used as a base for arranging the at least one color layer 33, which facilitates the formation of the at least one color layer 33. It should be understood that in some other embodiments, the composite layer 30 can be provided with no second substrate 34, and the at least one color layer 33 can be directly formed on the light absorption layer 32 by a printing or coating method. This is not specifically limited herein.

In an embodiment, the at least one color layer 33 can include at least two color layers stacked with each other. The at least two color layers can be respectively disposed at two opposite sides of the second substrate 34 in the first direction. Alternatively, the at least two color layers can be disposed at one side of the second substrate 34 in the first direction. This is not specifically limited herein.

The at least one color layer 33 can include an orange layer 332, a white layer 333, a gray layer 334, or any combination thereof. It should be understood that the at least one color layer 33 can include a color layer with another color in some other embodiments. This is not specifically limited herein.

In an embodiment, the at least one color layer 33 includes an orange layer 332 disposed at a side of the second substrate 34 facing the light absorption layer 32, as shown in FIG. 2, 3, or 4. The at least one color layer 33 can include one orange layer 332 or at least two orange layers 332. Referring to FIG. 3, the at least one color layer 33 including five orange layers 332 stacked with each other is shown. It should be understood that the number of the orange layers 332 is not limited in the present disclosure.

Figure 5:
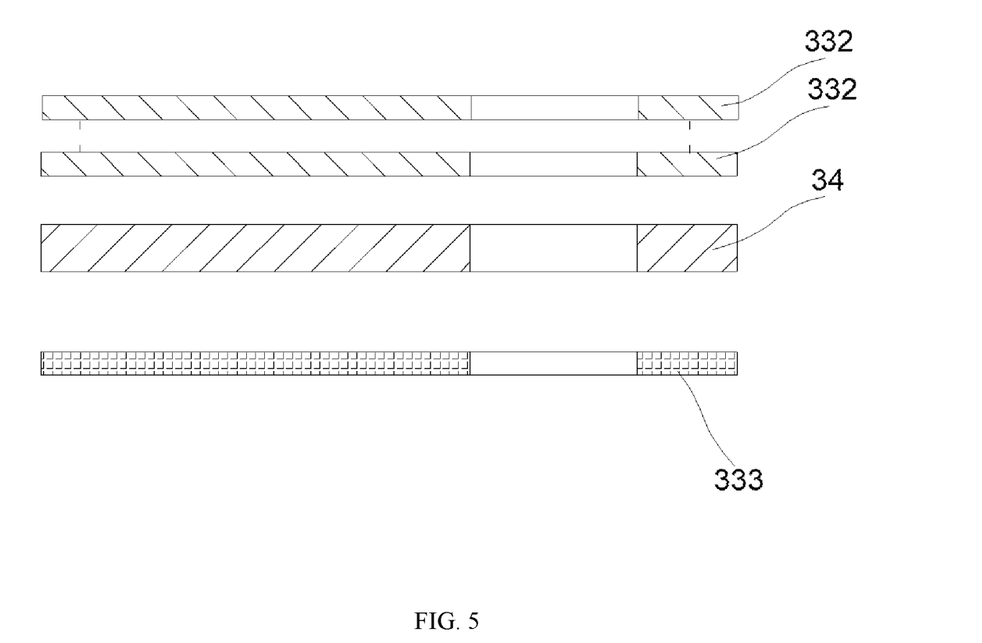
FIG. 5 is a schematic sectional view of a partial structure of the composite layer of the display panel according to another embodiment of the present disclosure.
Figure 6:
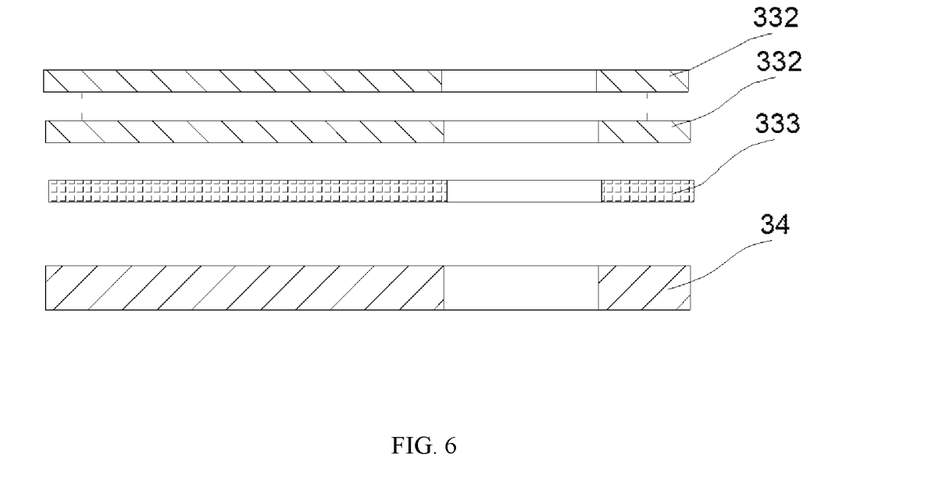
FIG. 6 is a schematic sectional view of a partial structure of the composite layer of the display panel according to another embodiment of the present disclosure.

FIG. 5 is a schematic sectional view of a partial structure of a composite layer of a display panel according to another embodiment of the present disclosure. FIG. 6 is a schematic sectional view of a partial structure of a composite layer of a display panel according to yet another embodiment of the present disclosure.

Referring to FIG. 5, in this embodiment, the at least one color layer 33 includes orange layers 332 disposed at a side of the second substrate 34 facing away from the light absorption layer 32. The at least one color layer 33 includes at least two orange layers 332 stacked with each other to ensure the relatively high intensity of the light reflected by the at least one color layer 33.

Referring to FIG. 6, in this embodiment, the at least one color layer 33 further includes a white layer 333 disposed between the orange layer 332 and the second substrate 34, so that the incident light passing through the orange layer 332 can be reflected back to the display module 10 by the white layer 333, thereby reducing the light output difference between the regions of the display module 10 respectively aligned with the hole region and the hole-free region of the composite layer 30 and reducing the mura problem on the display panel.

Figure 7:
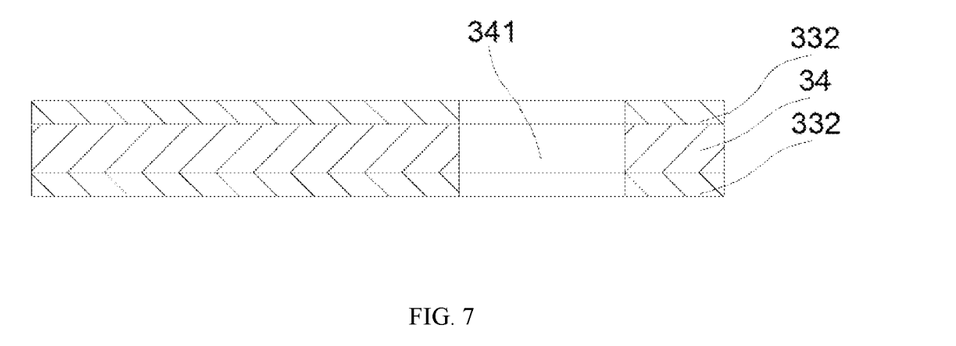
FIG. 7 is a schematic sectional view of a partial structure of the composite layer of the display panel according to another embodiment of the present disclosure.

FIG. 7 is a schematic sectional view of a partial structure of a composite layer of a display panel according to yet another embodiment of the present disclosure.

Referring to FIG. 7, in this embodiment, the at least one color layer 33 includes orange layers 332. The second substrate 34 is provided with the orange layers 332 at two opposite sides of the second substrate 34 in the first direction. The numbers of the orange layers 332 disposed at two opposite sides of the second substrate 34 can be equal to each other, for example, can be one, two, or more.

In an embodiment, two orange layers 332 are disposed at each of the two opposite sides of the second substrate 34, so that not only can the relatively high intensity of the light reflected by the at least one color layer 33 be ensured, but the thickness of the display panel can be relatively small.

Referring to FIGS. 4 to 6, the at least one color layer 33 can further include a white layer 333 disposed between the orange layers 332 and the light absorption layer 32, so that the light passing through the orange layer 332 can be reflected back to the display module 10 by the white layer 333, thereby ensuring the reflection effect of the at least one color layer 33. The at least one color layer 33 can include one white layer 333.

Figure 8:
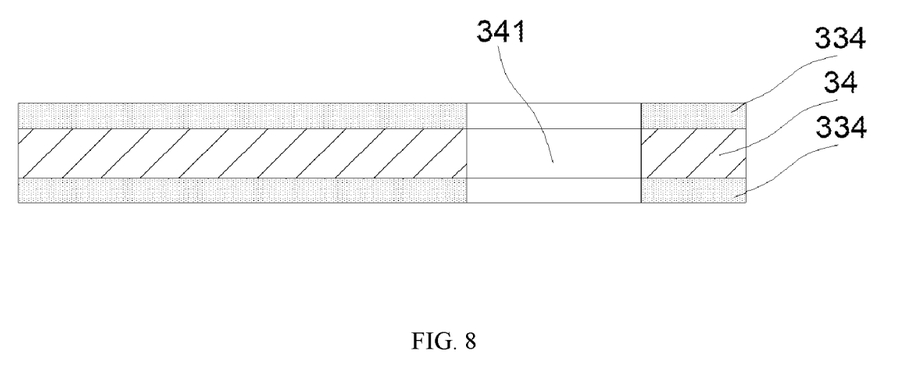
FIG. 8 is a schematic sectional view of a partial structure of the composite layer of the display panel according to another embodiment of the present disclosure.

FIG. 8 is a schematic sectional view of a partial structure of a composite layer of a display panel according to yet another embodiment of the present disclosure. Referring to FIG. 8, the at least one color layer 33 can include a gray layer 334. The gray layer 334 can be disposed at a side of the second substrate 34 facing the light absorption layer 32, a side of the second substrate 34 facing away from the light absorption layer 32, or each of the two sides of the second substrate 34.

In an embodiment, the gray layer 334 has a blackness of 50% of the blackness of pure black. In this way, a part of the incident light can be reflected back to the display module 10 by the gray layer 334 to reduce the mura problem when the display panel emits light. At the same time, another part of the incident light can be absorbed by the gray layer 334, to avoid the situation where the brightness of the hole-free region of the display panel is larger than that of the hole region of the display panel caused by too much reflected light.

It should be understood that the above-described orange layer 332, gray layer 334, and white layer 333 can be arbitrarily combined. A thickness of the at least one color layer 33 can be smaller than or equal to 10 μm.

Referring back to FIG. 2, in an embodiment, the at least one layer 33 may be not sufficient to reflect all incident light back to the display module. In view of this, the composite layer 30 can further include a metal layer 35. A fourth through hole 351 can be defined in the metal layer 35. The fourth through hole 351 can be located corresponding to (for example, aligned with) and in communication with the first through hole 321 and the second through hole 331. The fourth through hole 351, the third through hole 341, the second through hole 331, and the first through hole 321 can collectively form the through hole 31 in the composite layer 30. The metal layer 35 can be disposed between the light absorption layer 32 and the at least one color layer 33. As such, the part of incident light passing through the at least one color layer 33 can be reflected back to the at least one color layer 33 and thus back to the display module 10 by the metal layer 35, thus ensuring the reflection effect. Moreover, the metal layer 35 can enhance the strength of the display panel to prevent the break of the display panel. In an embodiment, the least one color layer 33 includes a plurality of orange layers 332 printed or coated on the side of the second substrate 34 facing the light absorption layer 32. The metal layer 35 is coated or deposited on a side of the plurality of orange layers 332 facing the light absorption layer 32. The metal layer 35 can be made of copper foil or other metal materials, which is not specifically limited herein.

Figure 9:
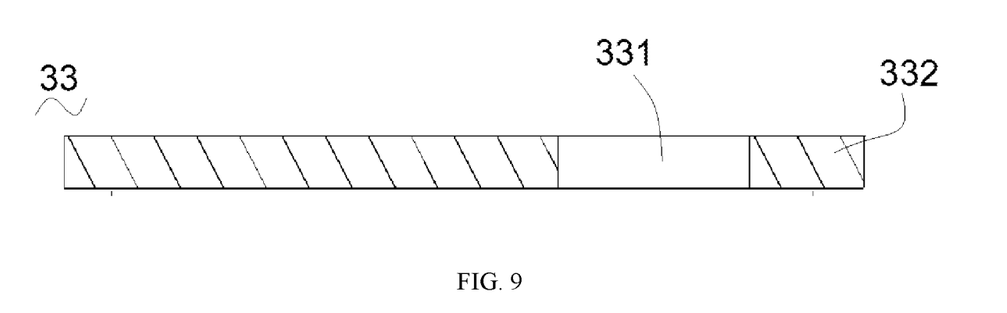
FIG. 9 is a schematic sectional view of a partial structure of the composite layer of the display panel according to another embodiment of the present disclosure.
Figure 10:
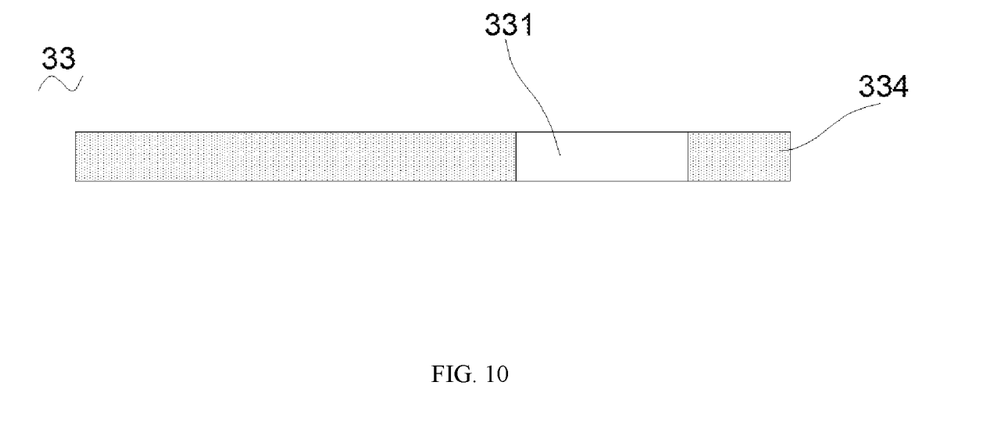
FIG. 10 is a schematic sectional view of a partial structure of the composite layer of the display panel according to another embodiment of the present disclosure.

FIG. 9 is a schematic sectional view of a partial structure of a composite layer of a display panel according to another embodiment of the present disclosure. FIG. 10 is a schematic sectional view of a partial structure of a composite layer of a display panel according to yet another embodiment of the present disclosure. The composite layer 30 can be disposed without the second substrate 34. The composite layer 30 can be formed directly without being attached to the second substrate 34. Referring to FIG. 9, the at least one color layer 33 can be one orange layer 332. Referring to FIG. 10, the at least one color layer 33 can be one gray layer 334.

Referring back to FIG. 1, in some embodiments, the composite layer 30 further includes a heat dissipation layer 36 disposed at a side of the light absorption layer 32 facing away from the display module 10 and configured to dissipate the heat from the display panel 100. The heat dissipation layer 36 can be a copper foil layer or can be made of other materials, which is not specifically limited herein.

Figure 11:
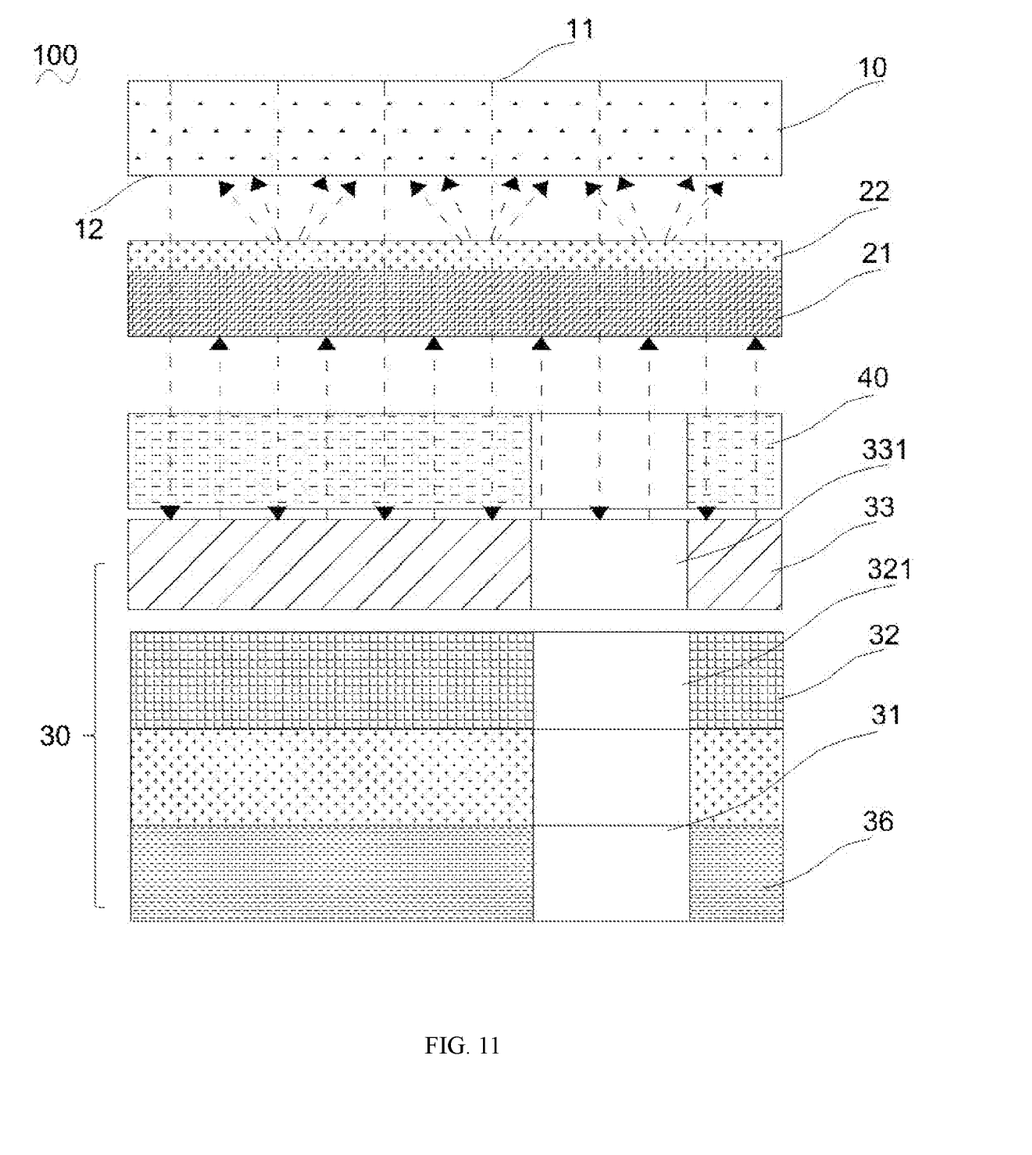
FIG. 11 is an exploded sectional view of the display panel according to another embodiment of the present disclosure.

FIG. 11 is an exploded sectional view of another embodiment of the display panel according to the present disclosure. Referring to FIG. 11, the display panel 100 can further include a scattering layer 22 disposed between the display module 10 and the at least one color layer 33. In this embodiment, the light reflected by the at least one color layer 33 will deviate from the original reflection path when the light passes through the scattering layer 22. The light path is shown with dashed lines in FIG. 11. The light respectively reflected by the hole-free region and hole region of the composite layer 30 will both deviate from the original reflection path due to the scattering effect, when the light passes through the scattering layer 22. Therefore, the quantities of light respectively reflected from the hole region and the hole-free region of the composite layer 30 to the display module 10 can tend to be identical, thereby reducing the difference between the quantities of light reflected back to the regions of the display module 10 respectively aligned with the first through hole 321 and the outside the first through hole 321, and thus further reducing the mura problem.

It should be noted that the scattering layer 22 can be an integral layer, so that the light reflected from both the hole region and hole-free region of the composite layer 30 can be scattered by the scattering layer 22. That is, no hole is defined in the scattering layer 22. The scattering layer 22 can be a portion of the support layer 20 and can be directly formed on the first substrate 21 of the support layer 20.

In an embodiment, the scattering layer 22 is formed at a side of the first substrate 21 facing the composite layer 30. It should be understood that the scattering layer 22 can be formed at a side of the first substrate 21 facing the display module 10 in another embodiment. This is not specifically limited herein.

In an embodiment, the scattering layer 22 includes scattering particles dispersed therein. The scattering particles can be selected from the group including organosilicon particles, polyethylene particles, acrylic resin particles, nano-barium sulfate particles, silicon dioxide particles, calcium carbonate particles, or any combination thereof. It should be understood that the scattering particles can be selected from particles made of other materials, which is not specifically limited herein.

Figure 12:
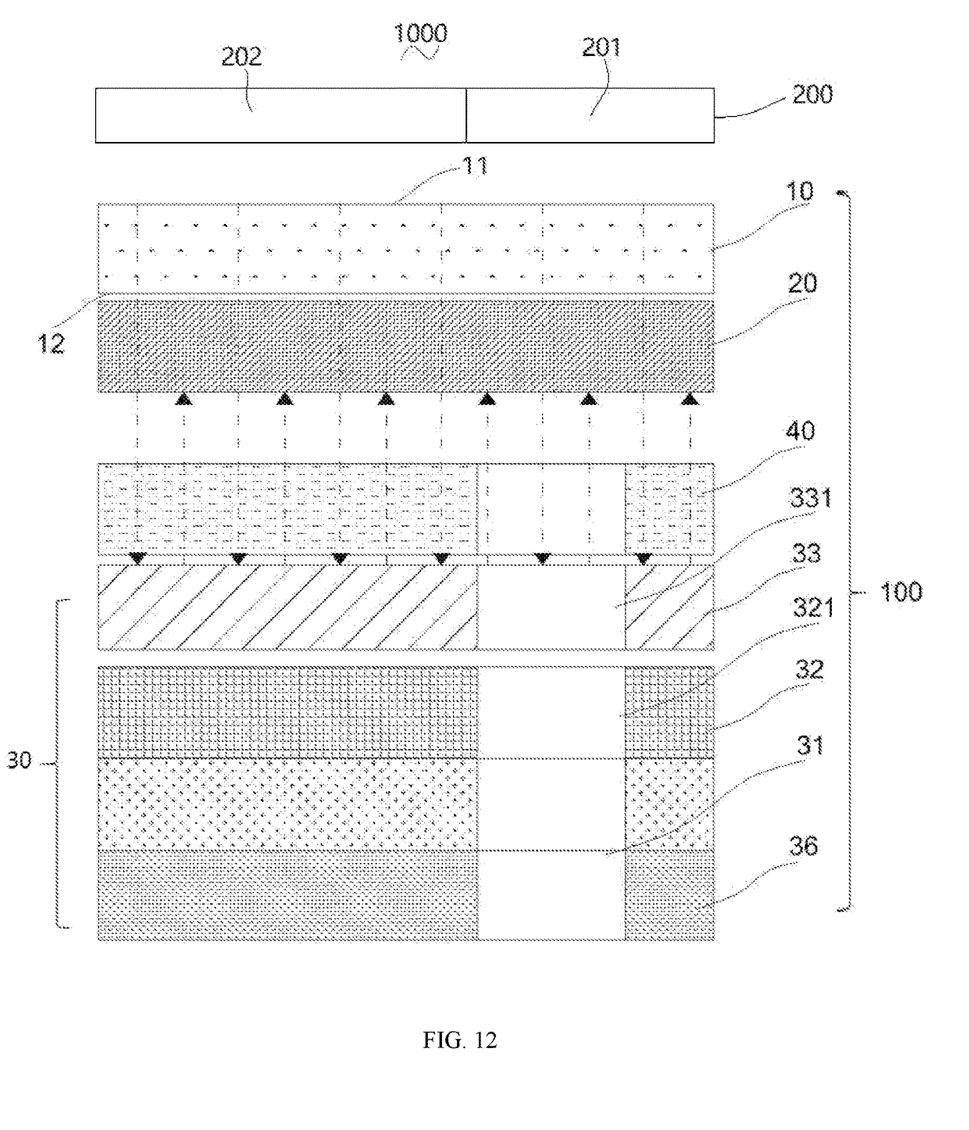
FIG. 12 is an exploded sectional view of a display device according to an embodiment of the present disclosure.

Referring to FIG. 12, a display device 1000 is further provided in the present disclosure. The display device 1000 can include the above-described display panel 100. The display device 1000 can be applied to the fields such as mobile terminal, bioelectronics, electronic skin, wearable apparatus, vehicle-mounted apparatus, IoT apparatus, and artificial intelligence apparatus. For example, the display device 1000 can be a mobile phone, a tablet, a palmtop, an iPod, a smart watch, or other digital devices.

The display device 1000 can further include a cover plate 200 disposed at a side of the display module 10 where the display face 11 is located. The cover plate 200 can have a first region 201 and a second region 202 adjacent to the first region 201. The second region 202 can be provided at least one side of the first region 201. In some embodiment, the first region 201 is a flat region, and the second region 202 can be a curved region (e.g., a curved groove region). There is a smooth transition between the first region 201 and the second region 202, so that a curved surface display effect can be achieved. The through hole 31 defined in the composite layer 30 can be aligned with the first region 201 of the cover plate 200, so that the optical fingerprint identification sensor is aligned with the first region 201 of the cover plate 200, and the unlocking function using the fingerprint can be achieved in the flat region of the cover plate 200. It should be understood that the through hole 31 can instead be aligned with the second region 202 of the cover plate 200, so that the optical fingerprint identification sensor is aligned with the second region 202 of the cover plate 200, and the unlocking function using the fingerprint can be achieved in the curved region of the cover plate 200.

The cover plate 200 can be attached to the display module 10 of the display panel 100 via an adhesive layer such as an OCA adhesive layer, a TPU adhesive layer, or other adhesive layers, an electrostatic attachment, or other means, which is not specifically limited herein.

The technical features of the above-mentioned embodiments can be combined arbitrarily. In order to make the description concise, not all possible combinations of the technical features are described in the embodiments. However, as long as there is no contradiction in the combination of these technical features, the combinations should be considered within the scope of the present disclosure.

The above-described embodiments are only several implementations of the present disclosure, and the descriptions are relatively specific and detailed, but the above-described embodiments should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A display panel, comprising:
   a display module having a display face and a non-display face opposite to the display face;
   at least one color layer disposed at a side of the display module away from the display face; and
   a light absorption layer disposed at a side of the at least one color layer away from the display module, a first through hole being defined in the light absorption layer;
   wherein a second through hole is defined in the at least one color layer, the second through hole is located corresponding to and in communication with the first through hole, and the first through hole and the second through hole are located corresponding to an external functional module;
   wherein a reflectivity of the at least one color layer is larger than or equal to 50%.

2. The display panel of claim 1, wherein the at least one color layer comprises an orange layer, a white layer, a gray layer, or any combination thereof.

3. The display panel of claim 1, wherein the at least one color layer comprises a plurality of orange layers stacked with each other.

4. The display panel of claim 1, wherein the at least one color layer comprises at least one orange layer and at least one white layer stacked with each other.

5. The display panel of claim 4, wherein the at least one white layer is located between the at least one orange layer and the light absorption layer.

6. The display panel of claim 1, further comprising:
   a transparent substrate disposed between the display module and the light absorption layer;
   wherein the at least one color layer is disposed on a surface of the transparent substrate, a third through hole is defined in the transparent substrate, and the third through hole is located corresponding to and in communication with the first through hole and the second through hole.

7. The display panel of claim 1, further comprising:
   a metal layer disposed between the light absorption layer and the at least one color layer;
   wherein a fourth through hole is defined in the metal layer, and the fourth through hole is located corresponding to, and in communication with, the first through hole and the second through hole.

8. The display panel of claim 7, wherein the metal layer is a copper foil.

9. The display panel of claim 1, further comprising a scattering layer disposed between the display module and the at least one color layer.

10. The display panel of claim 9, wherein the scattering layer comprises scattering particles dispersed therein; and
    wherein the scattering particles are selected from the group consisting of organosilicon particles, polyethylene particles, acrylic resin particles, nano-barium sulfate particles, silicon dioxide particles, calcium carbonate particles, and any combination thereof.

11. The display panel of claim 9, wherein the scattering layer is an integral layer without any hole.

12. The display panel of claim 1, wherein cross-sectional sizes of the first through hole and the second through hole are equal to each other; and
wherein projections of the first through hole and the second through hole on the display module coincide with each other.

13. The display panel of claim 1, wherein a thickness of the at least one color layer is smaller than or equal to 10 μm.

14. The display panel of claim 1, comprising:
a composite layer; and a support layer disposed between the display module and the composite layer to support the display module; wherein the at least one color layer is a portion of the composite layer or a portion of the support layer, or a layer separated from the composite layer and the support layer.

15. A display device, comprising a display panel, the display panel comprising:
a display module having a display face and a non-display face opposite to the display face;
at least one color layer disposed at a side of the display module away from the display face; and
a light absorption layer disposed at a side of the at least one color layer away from the display module, a first through hole being defined in the light absorption layer;
wherein a second through hole is defined in the at least one color layer, the second through hole is located corresponding to and in communication with the first through hole, and the first through hole and the second through hole are located corresponding to an external functional module;
wherein a reflectivity of the at least one color layer is larger than or equal to 50%.

16. The display device of claim 15, further comprising:
a cover plate disposed at a side of the display module adjacent to the display face and the external functional module disposed at the side of the display module away from the display face and disposed corresponding to the first through hole and the second through hole.

17. The display device of claim 16, wherein the cover plate comprises a flat region and a curved region adjacent to the flat region, and the first through hole, the second through hole, and the external functional module is in the flat region of the cover plate.

18. The display device of claim 16, wherein the cover plate comprises a flat region and a curved region adjacent to the flat region, and the first through hole, the second through hole, and the external functional module is in the curved region of the cover plate.

19. The display device of claim 16, wherein the cover plate is attached to the display module of the display panel.

20. The display device of claim 16, wherein external functional module is the optical fingerprint identification sensor.

* * * * *